(12) United States Patent
Jeong et al.

(10) Patent No.: US 8,927,372 B2
(45) Date of Patent: Jan. 6, 2015

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Yongkuk Jeong, Suwon-si (KR); Seung Ho Chae, Hwaseong-si (KR); Jung Shik Heo, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 55 days.

(21) Appl. No.: 13/765,150

(22) Filed: Feb. 12, 2013

(65) Prior Publication Data

US 2013/0302964 A1 Nov. 14, 2013

(30) Foreign Application Priority Data

May 9, 2012 (KR) ................ 10-2012-0049216

(51) Int. Cl.
*H01L 21/00* (2006.01)
*H01L 29/66* (2006.01)

(52) U.S. Cl.
CPC ...... *H01L 29/66477* (2013.01); *H01L 29/6656* (2013.01); *H01L 29/6659* (2013.01)
USPC ......................................... 438/287; 438/305

(58) Field of Classification Search
USPC .......................................... 438/301–305, 287
See application file for complete search history.

(56) References Cited

U.S. PATENT DOCUMENTS

| | | | | |
|---|---|---|---|---|
| 5,960,322 | A * | 9/1999 | Xiang et al. | 438/791 |
| 6,429,083 | B1 * | 8/2002 | Ishida et al. | 438/305 |
| 6,716,685 | B2 * | 4/2004 | Lahaug | 438/157 |
| 6,753,232 | B2 | 6/2004 | Kwak et al. | |
| 7,148,158 | B2 | 12/2006 | Ozawa et al. | |
| 2004/0166616 | A1 | 8/2004 | Lee et al. | |
| 2010/0084719 | A1 * | 4/2010 | Masuoka et al. | 257/411 |

FOREIGN PATENT DOCUMENTS

| | | |
|---|---|---|
| JP | 05-251463 | 9/1993 |
| JP | 2004-207613 | 7/2004 |
| JP | 2010-278464 | 12/2010 |
| KR | 1997-0013324 | 3/1997 |
| KR | 1020000003614 | 1/2000 |
| KR | 1020030001871 | 1/2003 |

* cited by examiner

*Primary Examiner* — Richard Booth
(74) *Attorney, Agent, or Firm* — F. Chau & Associates, LLC (57) ABSTRACT

A semiconductor device may include a first insulating layer disposed on a substrate, a gate electrode disposed on the first insulating layer, and a second insulating layer disposed on the gate electrode and the first insulating layer. The second insulating layer includes a first discharge site.

14 Claims, 12 Drawing Sheets

| Process | Number of Pitted Regions[EA] |
|---|---|
| M0 | 5921 |
| M0 +M2 | 4533 |
| M3 | 412 |
| M0 + M1 + M4 | 0 |
| M0 + M1 + M3 + M4 | 0 |

SEMICONDUCTOR DEVICE AND METHOD OF FABRICATING THE SAME

CROSS-REFERENCE TO RELATED APPLICATIONS

This application claims priority to Korean Patent Application No. 10-2012-0049216, filed on May 9, 2012, the disclosure of which is hereby incorporated by reference herein in its entirety.

(i) Technical Field

Embodiments of the inventive concepts relate to a semiconductor device and a method of fabricating the same, and in particular, to a semiconductor device with a gate electrode and a method of fabricating the same.

(ii) Discussion of the Related Art

Due to their small-size, multifunctionality, and/or low-cost characteristics, semiconductor devices are used as significant elements in the electronics industry. The semiconductor devices can be generally classified into, for example, a memory device for storing data, a logic device for processing data, and a hybrid device capable of performing various memory storage and data processing functions simultaneously.

Higher integration of semiconductor devices may be required to satisfy consumer demand for electronic devices with a fast speed. However, owing to increasing technical difficulties in a fabrication process, it is becoming harder to realize highly-integrated semiconductor devices. To overcome such difficulties, a variety of studies have been done recently on new technology for increasing an integration density of the semiconductor device.

SUMMARY

Example embodiments of the inventive concept provide a highly-integrated semiconductor device.

Example embodiments of the inventive concept provide a method of fabricating a highly-integrated semiconductor device.

According to an example embodiment of the inventive concepts, a semiconductor device may include a first insulating layer disposed on a substrate, a gate electrode disposed on the first insulating layer, and a second insulating layer disposed on the gate electrode and the first insulating layer. The second insulating layer includes a first discharge site.

In an example embodiment, the first discharge site of the second insulating layer may include at least one selected from the group consisting of hydrogen (H), nitrogen (N), carbon (C), fluorine (F), and chlorine (Cl).

In an example embodiment, the first insulating layer may include a second discharge site.

In an example embodiment, the second discharge site of the first insulating layer may include at least one selected from the group consisting of hydrogen, nitrogen, carbon, fluorine and chlorine.

In an example embodiment, the device may further include spacers disposed on the second insulating layer to face the gate electrode sidewalls. The spacers may include a second discharge site including substantially a same element as an element of the first discharge site.

According to an example embodiment of the inventive concepts, a method of fabricating a semiconductor device may include forming a first insulating layer and a gate electrode on a substrate, forming a second insulating layer on the first insulating layer and the gate electrode, forming a first discharge site in the second insulating layer, forming a plurality of sacrificial spacers on the second insulating layer to face opposing sidewalls of the gate electrode, and performing an ion injecting process using the sacrificial spacers as a mask to form a plurality of doped regions in portions of the substrate adjacent to the opposing sidewalls of the gate electrode.

In an example embodiment, the first discharge site may be formed by treating the second insulating layer with plasma of at least one selected from the group consisting of hydrogen, nitrogen, carbon, fluorine and chlorine.

In an example embodiment, the method may further include after the forming of the sacrificial spacers, forming a second discharge site in at least one of the sacrificial spacer and the second insulating layer. The second discharge site may include substantially a same element as an element of the first discharge site.

In an example embodiment, the second insulating layer may be formed by a thermal oxidation process.

In an example embodiment, the second insulating layer may be formed by a plasma enhanced oxidation process.

In an example embodiment, the method may further include removing the sacrificial spacer with phosphoric acid at a temperature ranging from about 100° C. to about 120° C.

In an example embodiment, the forming of the first discharge site may include treating the second insulating layer with at least one of hydrogen plasma, nitrogen plasma, ammonia plasma, carbon tetrafluoride plasma, or fluoromethane plasma.

According to an example embodiment of the inventive concept, a method of fabricating a semiconductor device is provided. The method includes forming a first insulating layer on a substrate, forming a gate electrode on the first insulating layer and a metal dielectric pattern between the first insulating layer and the gate electrode, forming a plurality of preliminary doped regions in the substrate adjacent to the gate electrode, forming a second insulating layer on the first insulating layer and the gate electrode, forming a plurality of sacrificial spacers on the second insulating layer to face opposing sidewalls of the gate electrode, forming a first discharge site in the second insulating layer and in the sacrificial spacers, performing an ion injecting process into portions of the substrate located around the sacrificial spacers and the gate electrode using the sacrificial spacers as a mask to form doped regions including the preliminary doped regions in the portions of the substrate located around the sacrificial spacers and the gate electrode and removing the sacrificial spacers.

The method further includes forming a third insulating layer on the second insulating layer and forming a plurality of spacers on the third insulating layer to face the opposing sidewalls of the gate electrode.

BRIEF DESCRIPTION OF THE DRAWINGS

Example embodiments can be more clearly understood from the following detailed description taken in conjunction with the accompanying drawings. The accompanying drawings represent non-limiting, example embodiments as described herein.

DETAILED DESCRIPTION OF EXEMPLARY EMBODIMENTS

Example embodiments of the inventive concepts will now be described more fully with reference to the accompanying drawings, in which example embodiments are shown. In the drawings, the thicknesses of layers and regions may be exaggerated for clarity. Like reference numerals in the drawings denote like elements throughout, and thus their description will be omitted.

It will be understood that when an element is referred to as being "connected" or "coupled" to another element, it can be directly connected or coupled to the other element or intervening elements may be present. Like numbers indicate like elements throughout. As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

FIGS. 1 through 4 are sectional views illustrating a method of fabricating a semiconductor device according to an example embodiment of the inventive concept. FIG. 3B is an enlarged view of a portion A of FIG. 3A.

Figure 1:
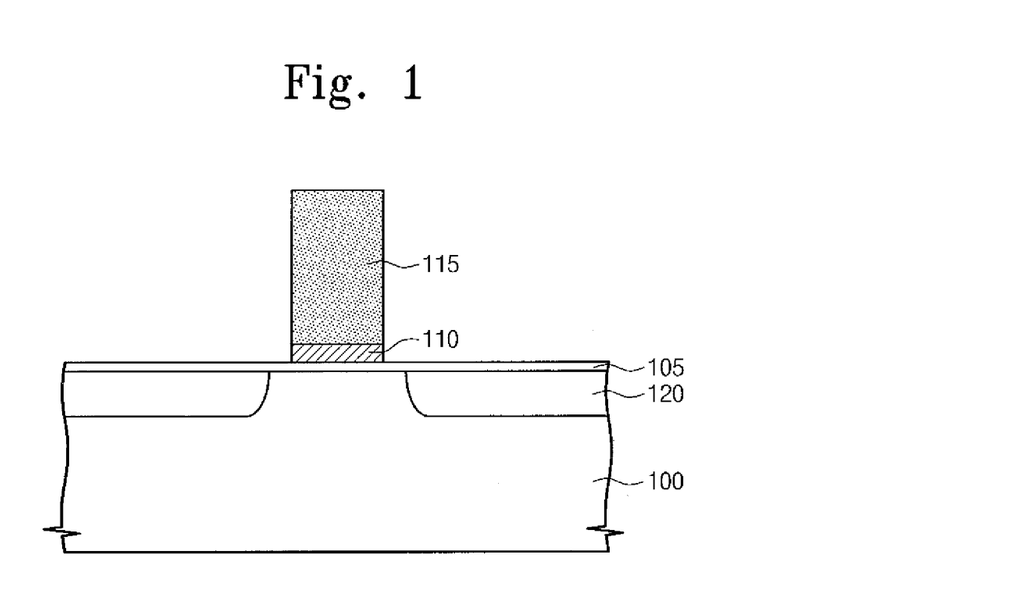
FIGS. 1 through 4 are sectional views illustrating a method of fabricating a semiconductor device according to an example embodiment of the inventive concept.

For example, referring to FIG. 1, a first insulating layer 105, a gate electrode 115 and preliminary doped regions 120 may be formed on a substrate 100.

For example, the substrate 100 may be a semiconductor substrate (e.g., formed of silicon). The first insulating layer 105 may be formed on the substrate 100. The first insulating layer 105 may be, for example, an oxide layer (e.g., a silicon oxide layer). In an example embodiment, the first insulating layer 105 may be, for example, a silicon oxide layer, which may be formed from the substrate 100 by a thermal oxidation.

In an example embodiment, a metal dielectric pattern 110 may, for example, be further formed between the first insulating layer 105 and the gate electrode 115.

For example, a metal dielectric (not shown) may be formed on the substrate 100, and a conductive layer (not shown) may be formed on the metal dielectric. The conductive layer may include, for example, a polysilicon layer, and the metal dielectric may include, for example, a hafnium oxide layer ($HfO_2$), a zirconium oxide layer ($ZrO_2$), or an aluminum oxide layer ($Al_2O_3$). The conductive layer and the metal dielectric may be patterned to form the metal dielectric pattern 110 and the gate electrode 115 on the first insulating layer 105.

For example, an ion implantation process may be performed using the gate electrode 115 as an ion mask to inject impurities into the substrate 100 around the gate electrode 115 and form the preliminary doped regions 120. The impurities may include, for example, the group 3 elements, such as boron (B) and gallium (Ga) or the group 5 elements, such as, nitrogen (N) and arsenic (As).

According to an embodiments of the inventive concept, the first insulating layer 105 may be, for example, partially etched during the process of etching the conductive layer and metal dielectric. In the case where the etching process is performed using plasma, the first insulating layer 105 may be damaged by the use of plasma.

Figure 2:
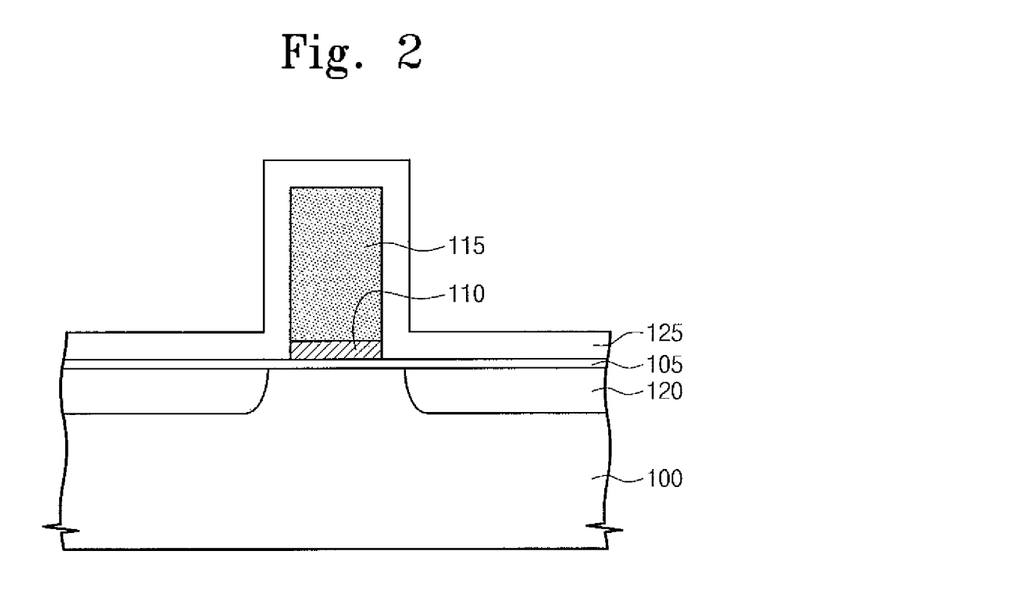

For example, referring to FIG. 2, a second insulating layer 125 may be formed on the first insulating layer 105 and the gate electrode 115.

In an example embodiment, the second insulating layer 125 may be, for example, an oxide layer formed by a thermal oxidation. Alternatively, the second insulating layer 125 may be, for example, a tetraethyl orthosilicate (TEOS) layer deposited at a temperature of about 300 to about 400° C.

In an embodiment, the second insulating layer 125 may be, for example, an oxide layer formed by a plasma enhanced oxidation process.

Figure 3A:
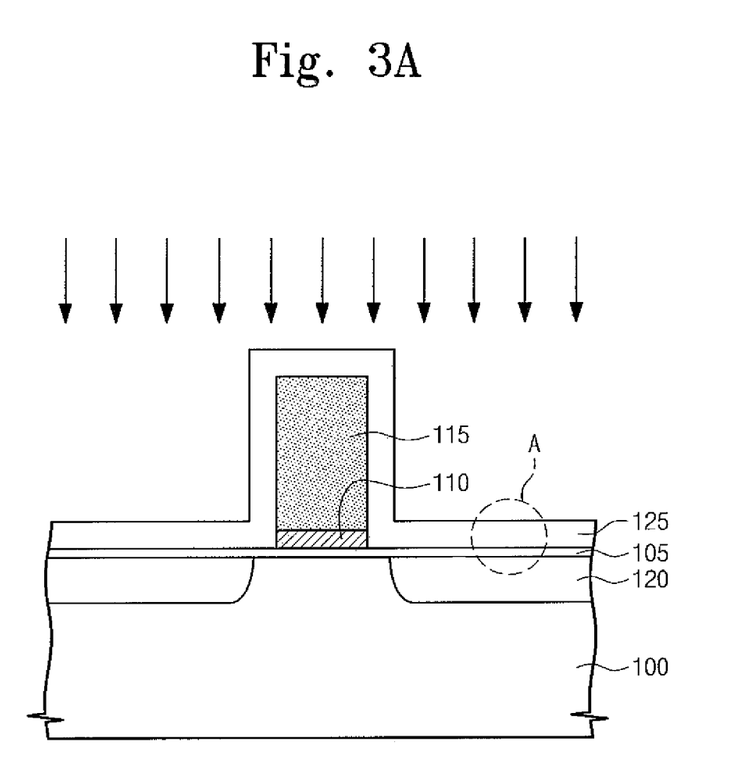
Figure 3B:
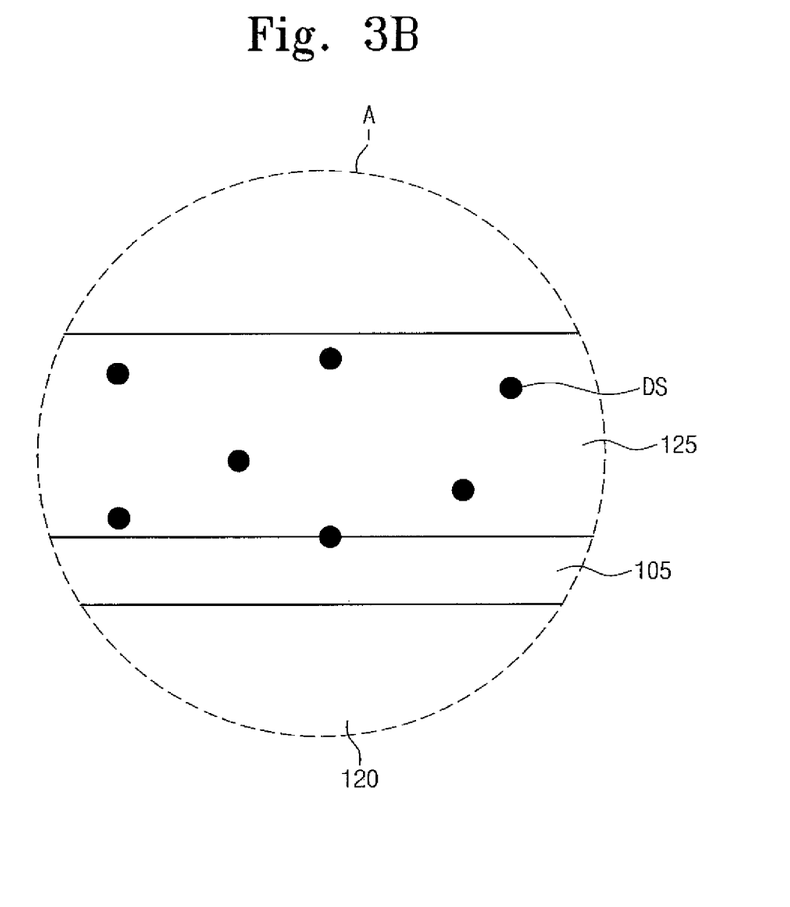

Referring, for example, to FIGS. 3A and 3B, discharge sites DS may be formed in the second insulating layer 125.

In an example embodiment, the formation of the discharge sites DS may include, for example, injecting at least one selected from the group consisting of hydrogen (H), nitrogen (N), carbon (C), fluorine (F) and chlorine (Cl) into the second insulating layer 125. Alternatively, the discharge sites DS may be formed by, for example, performing a plasma treatment to the second insulating layer 125.

For example, the formation of the discharge sites DS may include performing an ammonia ($NH_3$) plasma treatment to the second insulating layer 125. In this case, the discharge sites DS may include, for example, hydrogen atoms and/or nitrogen atoms. In an embodiment, the formation of the discharge sites DS may include, for example, performing a hydrogen ($H_2$) plasma treatment to the second insulating layer 125. In this case, the discharge sites DS may include, for example, hydrogen atoms. In an embodiment, the formation of the discharge sites DS may include, for example, performing a carbon tetrafluoride ($CF_4$) plasma treatment to the second insulating layer 125. In this case, the discharge sites DS may include, for example, carbon atoms and/or fluorine atoms. In an embodiment, the formation of the discharge sites DS may include, for example, performing a fluoromethane ($CH_3F$) plasma treatment to the second insulating layer 125. In this case, the discharge sites DS may include, for example, carbon atoms, hydrogen atoms, and/or fluorine atoms. Example embodiments are not limited to the above-mentioned materials used for the plasma treatment or for the discharge sites DS.

As shown in FIG. 3B, in addition to the discharge sites DS being formed in the second insulating layer 125, the discharge sites DS may also be formed in the first insulating layer 105.

Figure 4:
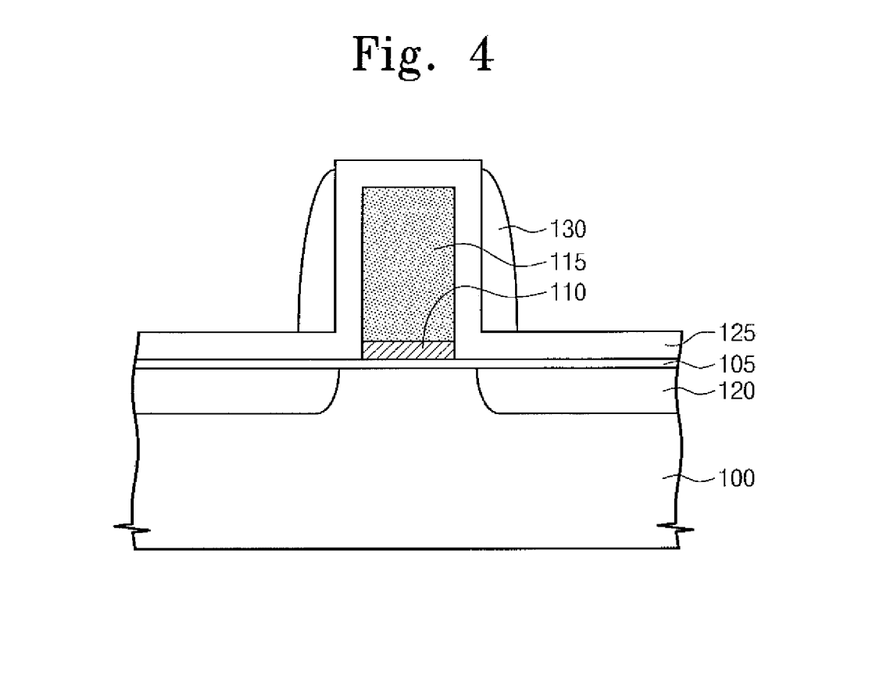

Referring to FIG. 4, a spacer 130, for example, may be locally formed on the second insulating layer 125 to face sidewalls of the gate electrode 115. The spacer 130 may include, for example, a nitride layer (e.g., a silicon nitride layer).

The formation of the spacer 130 may include, for example, forming a spacer layer (not shown) on the second insulating layer 125 and then anisotropically etching the spacer layer to remove the spacer layer from top surfaces of the gate electrode 115 and the substrate 100. The anisotropic etching step may be performed using, for example, plasma.

Although not shown in detail, impurities may be injected into the substrate 100 adjacent to the gate electrode 115 using, for example, the spacer 130 as an ion mask, thereby forming additional doped regions (not shown). The additional doped regions may be used, for example, to form a lightly-doped drain (LDD) structure.

Hereinafter, the discharge sites DS will be described in more detail.

The second insulating layer 125 may include at least one portion, which may be damaged by the plasma used during the formation of the spacer 130. If there are no discharge sites DS in the second insulating layer 125, electrical charges may be gathered at the damaged portion of the second insulating layer 125. The damaged portion of the second insulating layer 125 may, for example, be removed during a subsequent process (for example, a cleaning or etching process) to expose partially the gate electrode 115 thereunder. Further, the exposed portion of the gate electrode 115 may be, for example, also removed during a subsequent process.

According to an example embodiment of the inventive concept, the discharge sites DS may be formed, for example, in the second insulating layer 125. Due to the presence of the discharge sites DS, it is possible to discharge electric charges gathered by the plasma or at the damaged portion. This allows for the prevention of the second insulating layer 125 or the gate electrode 115 from being unintentionally etched or removed in a subsequent process.

FIGS. 5 through 10 are sectional views illustrating a method of fabricating a semiconductor device according to an example embodiment of the inventive concept.

Figure 5:
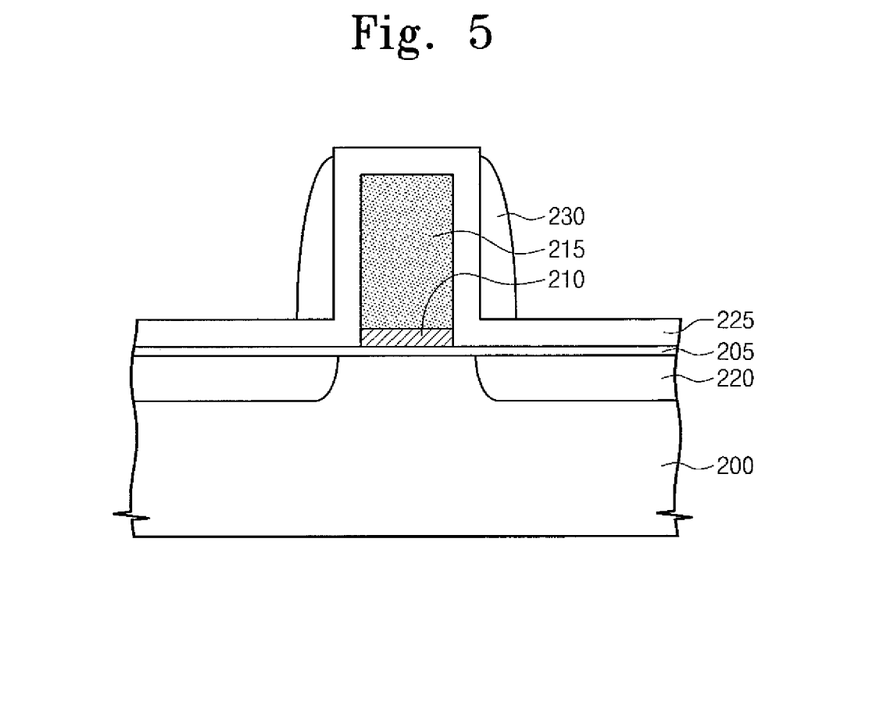
FIGS. 5 through 10 are sectional views illustrating a method of fabricating a semiconductor device according to an example embodiment of the inventive concept.

For example, referring to FIG. 5, a first insulating layer 205, a metal dielectric pattern 210, a gate electrode 215, a second insulating layer 225, preliminary doped regions 220, and a sacrificial spacer 230 may be formed on a substrate 200.

In an example embodiment, the first insulating layer 205, the metal dielectric pattern 210, the gate electrode 215, the second insulating layer 225, the preliminary doped regions 220, and the sacrificial spacer 230 may be formed using, for example, substantially the same process as that of the methods previously described with reference to FIGS. 1 through 4. Alternatively, in an embodiment, the first insulating layer 205, the metal dielectric pattern 210, the gate electrode 215, the second insulating layer 225, the preliminary doped regions 220, and the sacrificial spacer 230 may be formed using a fabricating method, which includes steps previously described with reference to FIGS. 1 through 4, but in which a step described with reference to FIGS. 3A and 3B is omitted.

Figure 6A:
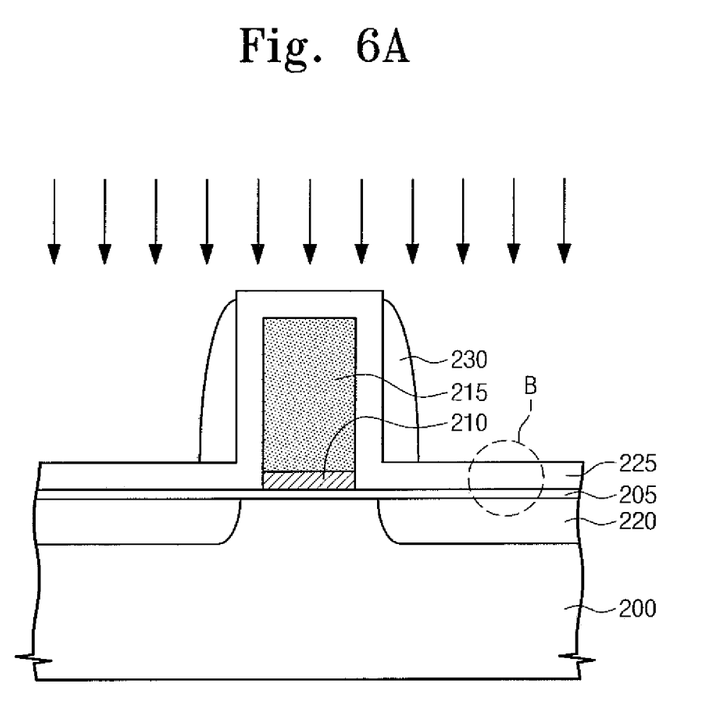
Figure 6B:
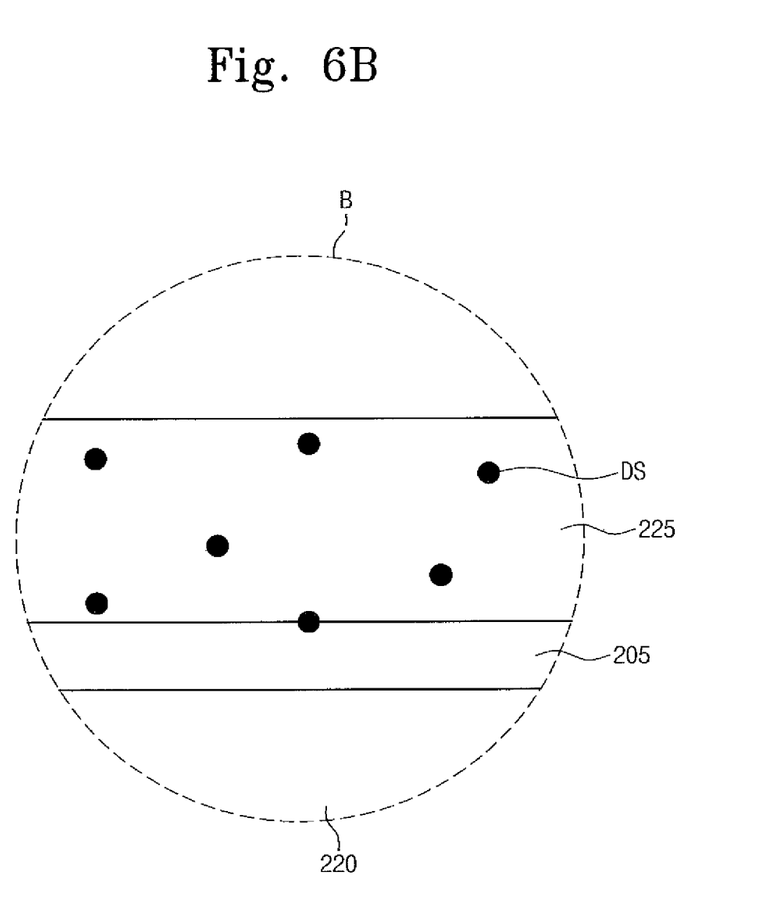

Referring to FIGS. 6A and 6B, for example, discharge sites DS may be formed in the sacrificial spacer 230 and the second insulating layer 225.

In an example embodiment, the formation of the discharge sites DS may include, for example, injecting at least one selected from the group consisting of hydrogen (H), nitrogen (N), carbon (C), fluorine (F) and chlorine (Cl) into the sacrificial spacer 230 and the second insulating layer 225. Alternatively, the discharge sites DS may be formed by, for example, performing a plasma treatment to the sacrificial spacer 230 and the second insulating layer 225. For example, as shown in FIG. 6B, in addition to the discharge sites DS being formed in the second insulating layer 225 and the sacrificial spacer 230, the discharge sites DS may also be formed in the first insulating layer 205. The discharge sites DS may be formed using, for example, the methods described with reference to FIGS. 3A and 3B, and thus, a detailed description thereof will be omitted to avoid redundancy.

Figure 7:
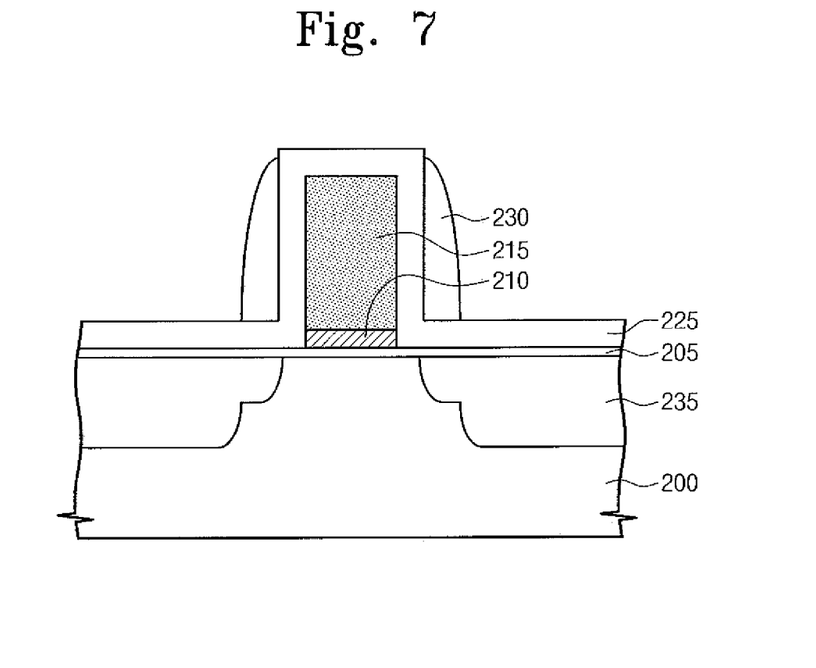

Referring to FIG. 7, impurities may be injected into portions of the substrate 200 located around the sacrificial spacer 230 and the gate electrode 215 using, for example, the sacrificial spacer 230 as an ion injection mask, thereby forming doped regions 235 including the preliminary doped regions 220. In an example embodiment, each of the doped regions 235 may be formed to have, for example, the LDD structure.

Figure 8:
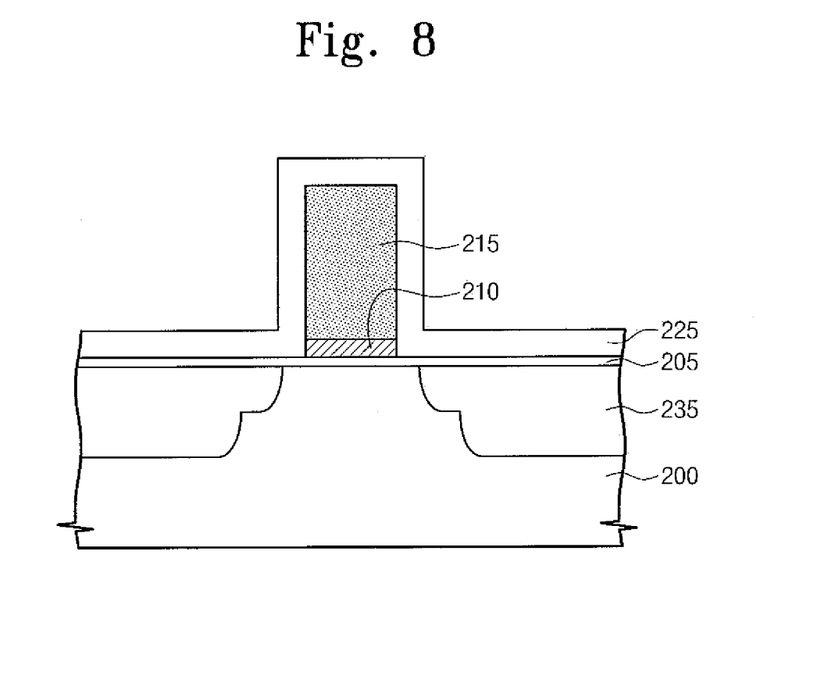

Referring to FIG. 8, the sacrificial spacer 230 may be removed.

In an example embodiment, the removal of the sacrificial spacer 230 may be performed using, for example, phosphoric acid ($H_3PO_4$). The removal of the sacrificial spacer 230 may be performed, for example, at a temperature ranging from about 100° C. to about 120° C., which may be lower than a temperature used in a conventional process of removing the sacrificial spacer 230.

In the case where the sacrificial spacer 230 is removed at a low temperature, it is possible to prevent portions of the second insulating layer 225 (for example, damaged by plasma) from being removed during a subsequent process (e.g., a cleaning or etching process).

Figure 9:
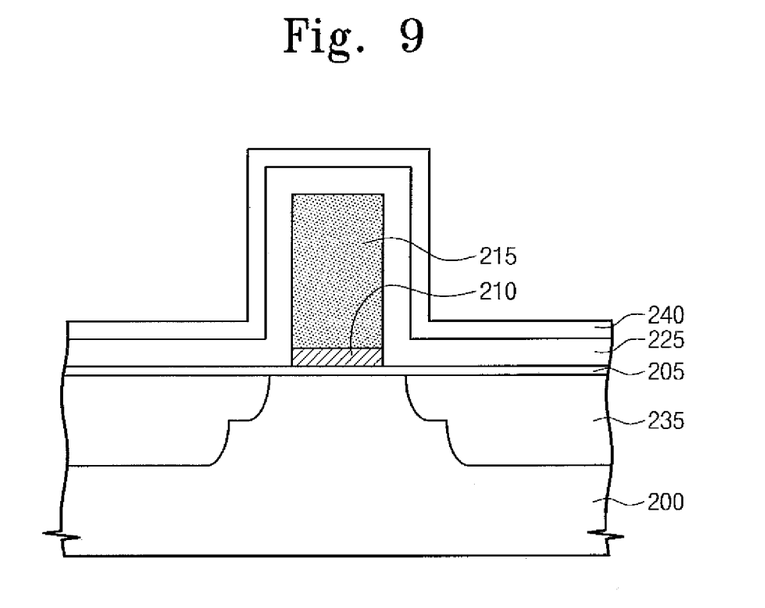

For example, referring to FIG. 9, a third insulating layer 240 may be formed on the second insulating layer 225.

Due to the formation of the third insulating layer 240, an upper portion of the gate electrode 215 can be prevented from being exposed during a subsequent process. For example, the gate electrode 215 may be used as a gate electrode of a transistor constituting a logic circuit. In the meantime, gate electrodes of memory cells may include a silicide layer formed by a silicidation process of a metal layer. In this case, as the third insulating layer 240 may cover the gate electrode 215 of the logic transistor, the gate electrode 215 of the logic transistor can be prevented from being silicided during the silicidation process for forming the gate electrodes of the memory cells.

The third insulating layer 240 may include an insulating material, such as, for example, an oxide, a nitride, or an oxynitride.

Figure 10:
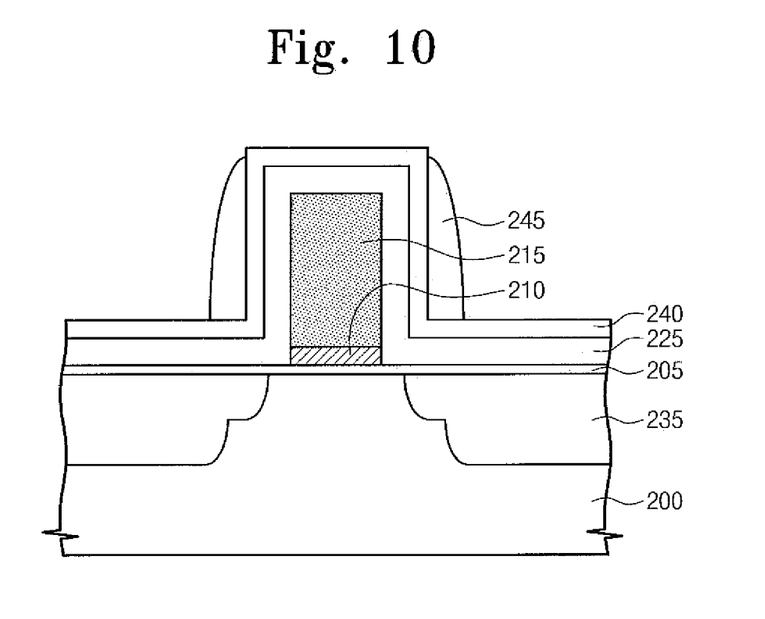

Referring to FIG. 10, a spacer 245, for example, may be locally formed on the third insulating layer 240 to face sidewalls of the gate electrode 215. The spacer 245 may, for example, separate adjacent gate electrodes 215 electrically from each other and provide an alignment margin in a subsequent process to form conductive patterns (e.g., contact plugs). The spacer 245 may include, for example, a nitride layer.

Figure 11:
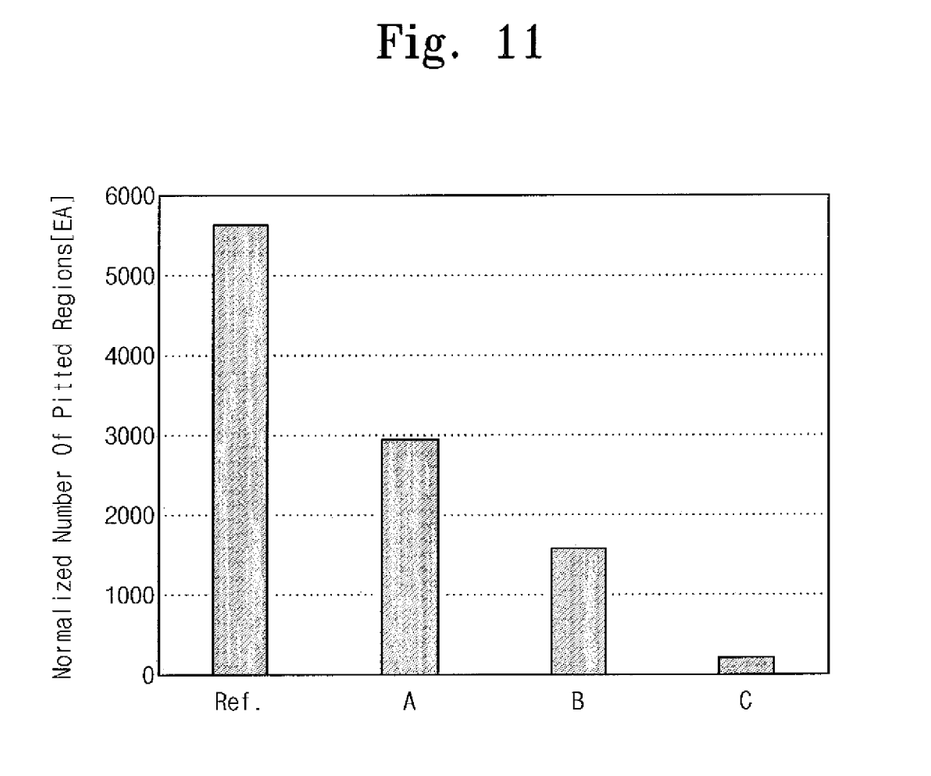
FIGS. 11 through 13 are graphs and table showing the numbers of pitted regions measured from a semiconductor device according to an example embodiment of the inventive concept.
Figure 12:
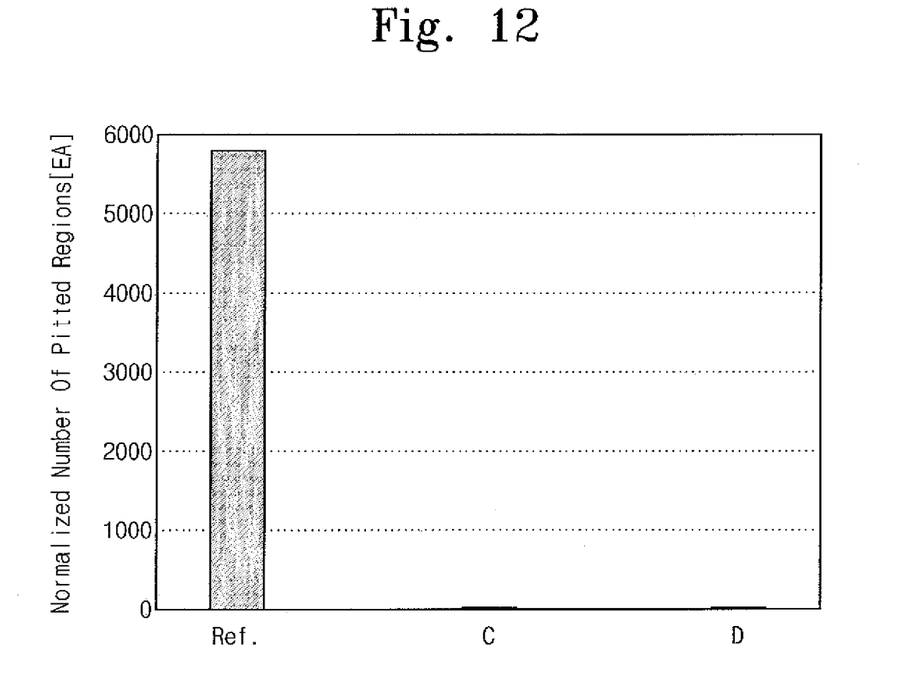
Figure 13:
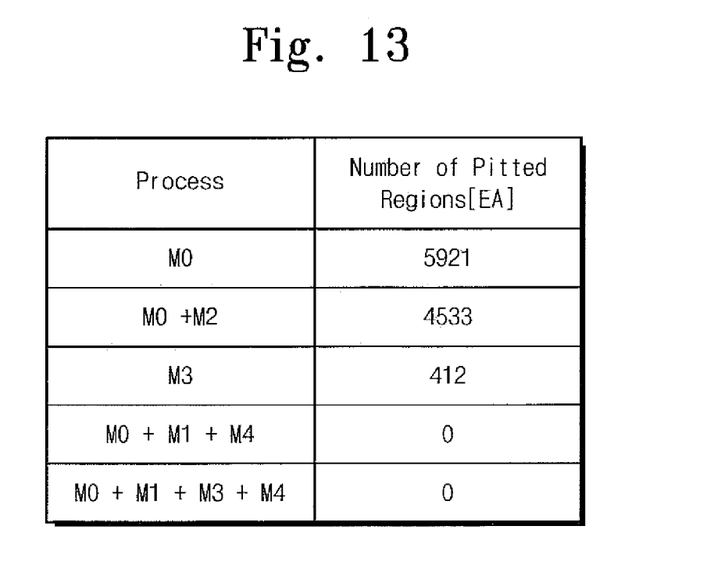

FIGS. 11 through 13 are graphs and table showing the numbers of pitted regions measured from a semiconductor device according to an example embodiment of the inventive concept.

The graph of FIG. 11 shows the result of a cleaning process applied to samples including the second insulating layers that were formed by the method of FIGS. 3A and 3B. The second insulating layer may not be treated by plasma (denoted by "Ref"), or may be treated by nitrogen ($N_2$) plasma (denoted by "A"), or may be treated by hydrogen ($H_2$) plasma (denoted by "B"), or may be treated by ammonia ($NH_3$) plasma (denoted by "C").

Referring to FIG. 11, for the sample denoted by "Ref", an upper surface of the second insulating layer was partially removed to form pitted regions, each of which exposes a gate electrode provided thereunder. For the sample of "Ref", the number of the pitted regions was about 5,500. By contrast, the number of the pitted regions was about 3,000 for the sample of "A" treated by the nitrogen plasma, about 1,500 for the sample of "B" treated by the hydrogen plasma, and several tens for the sample of "C" treated by the ammonia plasma.

From the result of FIG. 11, it can be said that the number of the pitted regions is significantly reduced by performing a plasma treatment of nitrogen, hydrogen, and/or ammonia to the second insulating layer.

Referring to FIG. 12, for the graph of "Ref", a plasma treatment was not performed to the second insulating layer, but a cleaning process was performed to the second insulating layer. For the graph of "C", as described with reference to FIGS. 3A and 3B, an ammonia plasma treatment and the cleaning process were performed to the second insulating layer. For the graph of "D", as described with reference to FIGS. 6A and 6B, a nitrogen plasma treatment was performed to the second insulating layer provided with the sacrificial spacer, and then the cleaning process was performed to the second insulating layer.

Referring to FIG. 12, the number of the pitted regions was about 5,500 for the sample of "Ref", while in substantial there was no pitted region for the samples of "C" and "D".

From this result, it can be said that the ways of treating the second insulating layer with ammonia plasma or treating the second insulating layer provided with the sacrificial spacer with nitrogen plasma are effective in decreasing the number of the pitted regions after the cleaning process, compared with the sample of "Ref".

FIG. 13 shows the numbers of the pitted regions formed on the second insulating layers, according to an embodiment.

For a process denoted by M0, as described with reference to FIGS. 3A and 3B, the second insulating layer was treated by ammonia plasma and then was cleaned. For a process denoted by M1, as described with reference to FIGS. 6A and 6B, the second insulating layer provided with the sacrificial spacer was treated by nitrogen plasma and then was cleaned. For a process denoted by M2, as described with reference to FIG. 7, after forming the sacrificial spacer, impurities were injected into the second insulating layer with a decreased beam current.

For a process denoted by M3, as described with reference to FIG. 2, the second insulating layer was formed by the plasma enhanced oxidation process. By contrast, for the processes of M0, M1, and M2, the second insulating layer was an oxide layer formed by the thermal oxidation process. For a process denoted by M4, as described with reference to FIG. 8, the sacrificial spacer was removed at a temperature of about 120° C. Here, the second insulating layer located below the sacrificial spacer was an oxide layer formed by the thermal oxidation process.

Referring to FIG. 13, the number of the pitted regions was about 6,000 when the process of M0 was solely used, while it was about 4,500 when the processes of M0 and M2 were used together. Furthermore, the number of the pitted regions was reduced to about 400, even when the process of M3 was solely used. In the case where the processes of M0, M1, and M4 or of M0, M1, M3, and M4 were used together, the number of the pitted regions was substantially zero.

From this, it can be said that a way of sequentially performing the afore-described processes is effective in reducing the number of the pitted regions on the second insulating layer. Example embodiments of the inventive concept may include various combinations of the afore-described processes.

Figure 14:
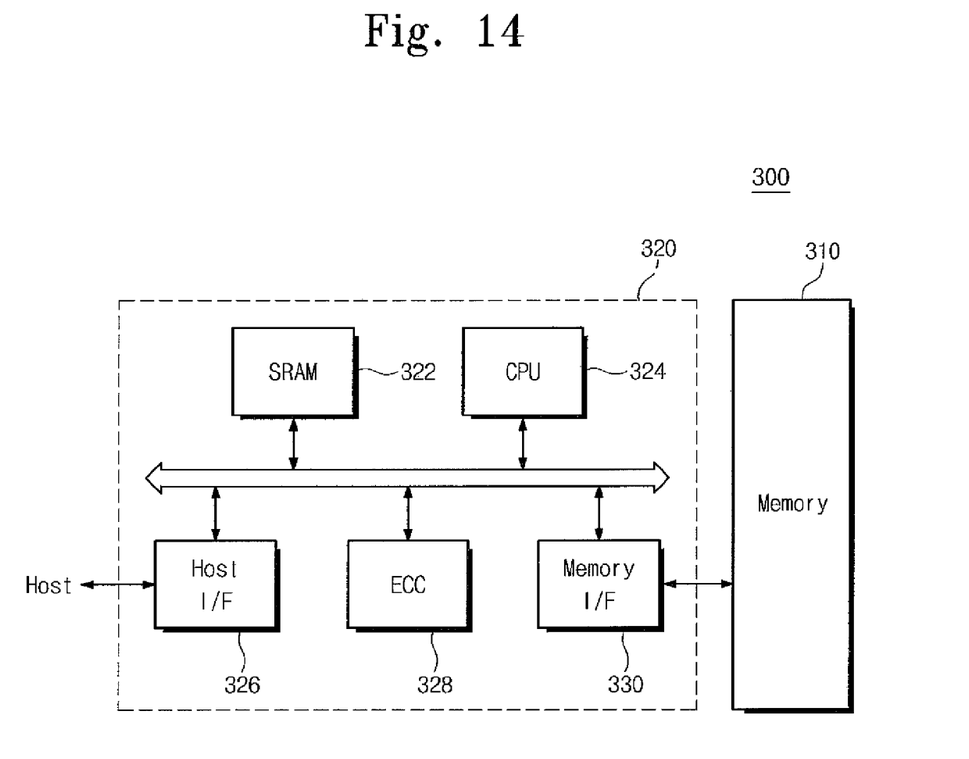
FIG. 14 is a block diagram illustrating a memory card including a semiconductor device according to an example embodiment of the inventive concept.

FIG. 14 is a block diagram illustrating a memory card including a semiconductor device according to an example embodiment of the inventive concept.

Referring to FIG. 14, a semiconductor device according to an exemplary embodiment of the inventive concept may be applied to form a memory card 300. The memory card 300 may include, for example, a memory controller 320 to control a data exchange between a host and a memory device 310. A static random access memory 322 may be used as an operation memory of a central processing unit 324. A host interface 326 may include, for example, at least one data exchange protocol of the host connected to the memory card 300. An error correction code 328 may detect and correct at least one error that may be included in data read from the memory device 310. A memory interface 330 can interface with the memory device 310. The central processing unit 324 can control data exchange of the memory controller 320 with, for example, the memory device 310.

The memory device 310 in the memory card 300 may be a semiconductor device according to an exemplary embodiment of the inventive concept. Accordingly, the discharge sites DS may be formed in the insulating layer provided in the memory device 310, and this allows for the prevention of electric charges from crowding at localized regions. Further, this allows for the prevention of the insulating layer from being unintentionally removed in a subsequent process.

Figure 15:
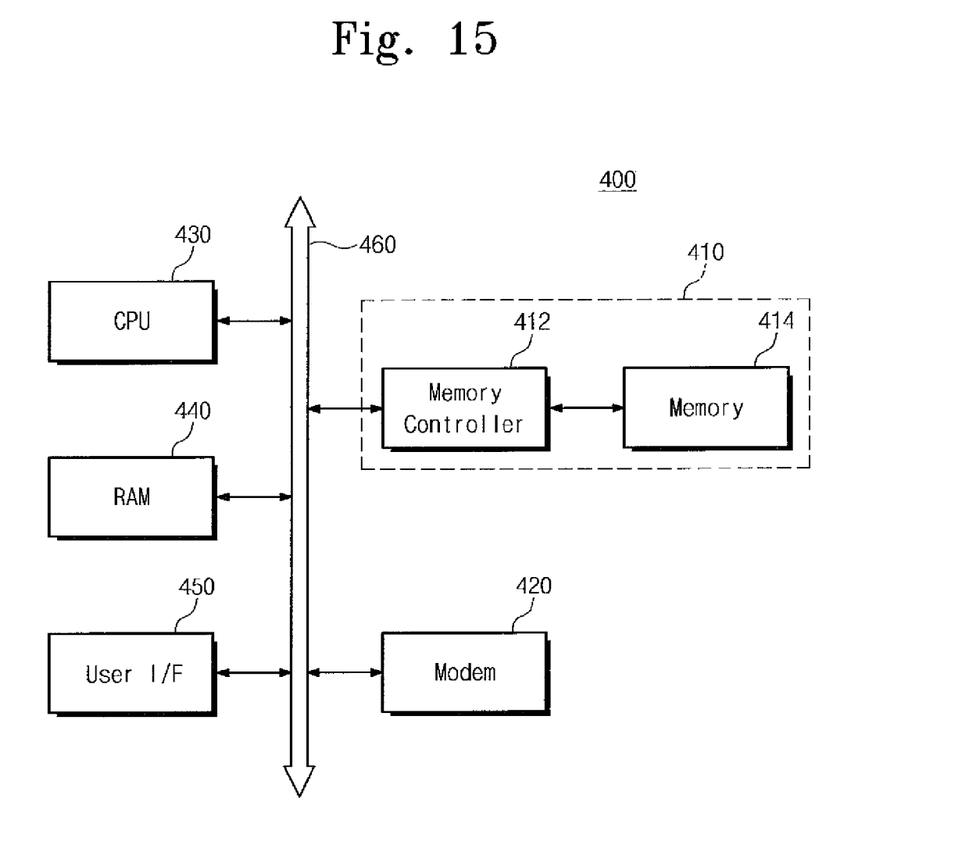
FIG. 15 is a block diagram illustrating an information processing system including a semiconductor device according to an example embodiment of the inventive concept.

FIG. 15 is a block diagram illustrating an information processing system including a semiconductor device according to an example embodiment of the inventive concept.

Referring to FIG. 15, an information processing system 400 may include, for example, a semiconductor device according to exemplary embodiments of the inventive concept. The information processing system 400 may include, for example, a mobile device or a computer. As an illustration, the information processing system 400 may include, for example, the memory system 410, a modem 420, a central processing unit (CPU) 430, a random access memory (RAM) 440, and a user interface 450 that are electrically connected to a system bus 460. The memory system 410 may, for example, store data processed by the central processing unit (CPU) 430 and data inputted from the outside (e.g., via the user interface 450 and/or the modem 420). The memory system 410 may include, for example, a memory 412 and a memory controller 414. The memory system 410 may be, for example, the same as the memory card 300 described with reference to FIG. 14. The information processing system 400 may be provided as, for example, a memory card, a solid state disk, a camera image sensor and an application chip set. For example, the memory system 410 may be a solid state disk (SSD). The information processing system 400 may stably and reliably store data in the memory system 410.

According to example embodiments of the inventive concept, discharge sites may be formed in an insulating layer to prevent electric charges from crowding. Due to the presence of the discharge sites, it is possible to prevent the insulating layer from being unintentionally etched or removed in a subsequent process. As a result, a semiconductor device including the insulating layer can be formed to have increased reliability.

Having described exemplary embodiments of the inventive concept, it is further noted that it is readily apparent to those of ordinary skill in the art that various modifications may be made without departing from the spirit and scope of the invention which is defined by the metes and bounds of the appended claims.

What is claimed is:

1. A method of fabricating a semiconductor device, comprising:

forming a first insulating layer, a metal dielectric pattern and a gate electrode on a substrate;

forming a second insulating layer on the first insulating layer and the gate electrode;

forming a first discharge site in the second insulating layer;

forming a plurality of sacrificial spacers on the second insulating layer to face opposing sidewalls of the gate electrode; and performing an ion injecting process using the sacrificial spacers as a mask to form a plurality of doped regions in portions of the substrate adjacent to the opposing sidewalls of the gate electrode, wherein the forming of the gate electrode and the metal dielectric pattern comprises:

forming a metal dielectric on the substrate;

forming a conductive layer on the metal dielectric, wherein the conductive layer includes a polysilicon layer and the metal dielectric includes one of a hafnium oxide layer ($HfO_2$), a zirconium oxide layer ($ZrO_2$), or an aluminum oxide layer ($Al_2O_3$), and patterning the conductive layer and the metal dielectric to form the gate electrode on the first insulating layer and the metal dielectric pattern between the first insulating layer and the gate electrode.

2. The method of claim 1, wherein the first discharge site is formed by treating the second insulating layer with plasma of at least one selected from the group consisting of hydrogen, nitrogen, carbon, fluorine and chlorine.

3. The method of claim 1, further comprising, after the forming of the sacrificial spacers, forming a second discharge site in at least one of the sacrificial spacer and the second insulating layer, wherein the second discharge site includes substantially a same element as an element of the first discharge site.

4. The method of claim 1, wherein the second insulating layer is formed by a thermal oxidation process.

5. The method of claim 1, wherein the second insulating layer is formed by a plasma enhanced oxidation process.

6. The method of claim 1, further comprising, removing the sacrificial spacers with phosphoric acid at a temperature ranging from about 100° C. to about 120° C.

7. The method of claim 1, wherein the forming of the first discharge site comprises treating the second insulating layer with at least one of hydrogen plasma, nitrogen plasma, ammonia plasma, carbon tetrafluoride plasma, and fluoromethane plasma.

8. The method of claim 1, wherein the forming of the first discharge site comprises injecting at least one selected from the group consisting of hydrogen, nitrogen, carbon, fluorine and chlorine into the second insulating layer.

9. The method of claim 1, wherein the second insulating layer is a tetraethyl orthosilicate (TEOS) layer deposited at a temperature of about 300° C. to about 400° C.

10. A method of fabricating a semiconductor device, comprising:

forming a first insulating layer on a substrate;

forming a gate electrode on the first insulating layer and a metal dielectric pattern between the first insulating layer and the gate electrode;

forming a plurality of preliminary doped regions in the substrate adjacent to the gate electrode;

forming a second insulating layer on the first insulating layer and the gate electrode;

forming a plurality of sacrificial spacers on the second insulating layer to face opposing sidewalls of the gate electrode;

forming a first discharge site in the second insulating layer and in the sacrificial spacers;

performing an ion injecting process into portions of the substrate located around the sacrificial spacers and the gate electrode using the sacrificial spacers as a mask to form doped regions including the preliminary doped regions in the portions of the substrate located around the sacrificial spacers and the gate electrode;

removing the sacrificial spacers;

forming a third insulating layer on the second insulating layer; and forming a plurality of spacers on the third insulating layer to face the opposing sidewalls of the gate electrode, wherein the forming of the gate electrode and the metal dielectric pattern comprises:

forming metal dielectric on the substrate;

forming a conductive layer on the metal dielectric, wherein the conductive layer includes a polysilicon layer and the metal dielectric includes one of a hafnium oxide layer ($HfO_2$), a zirconium oxide layer ($ZrO_2$), or an aluminum oxide layer ($Al_2O_3$), and patterning the conductive layer and the metal dielectric to form the gate electrode on the first insulating layer and the metal dielectric pattern between the first insulating layer and the gate electrode.

11. The method of claim 10, wherein the third insulating layer includes one of an oxide, a nitride or an oxynitride.

12. The method of claim 10, wherein the spacers disposed on the third insulating layer include a nitride layer.

13. The method of claim 10, further comprising forming a second discharge site in the second insulating layer prior to the forming of the sacrificial spacers.

14. The method of claim 10, wherein the first insulating layer is a silicon oxide layer formed from the substrate by a thermal oxidation process.

* * * * *